(12) United States Patent
Huang et al.

(10) Patent No.: US 9,966,935 B2
(45) Date of Patent: May 8, 2018

(54) LATCH CIRCUIT AND METHOD OF OPERATING THE LATCH CIRCUIT

(71) Applicant: TAIWAN SEMICONDUCTOR MANUFACTURING COMPANY, LTD., Hsinchu (TW)

(72) Inventors: Tsung-Ching (Jim) Huang, Mountain View, CA (US); Chan-Hong Chern, Palo Alto, CA (US); Ming-Chieh Huang, San Jose, CA (US); Chih-Chang Lin, San Jose, CA (US); Tien-Chun Yang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days. days.

(21) Appl. No.: 14/630,941

(22) Filed: Feb. 25, 2015

(65) Prior Publication Data
US 2016/0248408 A1    Aug. 25, 2016

(51) Int. Cl.
*H03K 3/356*    (2006.01)
(52) U.S. Cl.
CPC .............................. *H03K 3/356104* (2013.01)
(58) Field of Classification Search
None
See application file for complete search history.

(56) References Cited

U.S. PATENT DOCUMENTS

| | | | | |
|---|---|---|---|---|
| 6,018,260 A | * | 1/2000 | Gabara | H03K 3/356 327/201 |
| 6,255,875 B1 | | 7/2001 | Gabara | |
| 6,433,586 B2 | * | 8/2002 | Ooishi | H03K 19/00 326/113 |
| 6,819,156 B1 | | 11/2004 | Nix | |
| 7,570,082 B2 | | 8/2009 | Gebara et al. | |
| 2002/0000834 A1 | | 1/2002 | Ooishi | |

FOREIGN PATENT DOCUMENTS

JP    2013-106268    5/2013
KR   10-2007-0038607    4/2007

OTHER PUBLICATIONS

Office Action dated Jun. 13, 2016 and English translation from corresponding No. KR 10-2015-0089847.

* cited by examiner

*Primary Examiner* — Long Nguyen
(74) *Attorney, Agent, or Firm* — Hauptman Ham, LLP

(57) ABSTRACT

A latch circuit includes a first input node, a second input node, a first output node, a second output node, a first switching device coupled between the first output node and the second output node, and a first amplification circuit coupled with the first input node, the second input node, the first output node, and the second output node. The first switching device is configured to be turned on in response to a first state of a clock signal and to be turned off in response to a second state of the clock signal. The first amplification circuit is configured to cause a voltage difference across the first switching device based on voltage levels of the first input node and the second input node in response to the first state of the clock signal.

20 Claims, 9 Drawing Sheets

LATCH CIRCUIT AND METHOD OF OPERATING THE LATCH CIRCUIT

BACKGROUND

A latch circuit is a circuit that is configured to retain or retime an input signal in the form of a logical value. In some applications, such as mixed-signal circuit applications including communication and high-performance computing, latch circuits are used for processing a signal that have a data rate of 10 Gb/s or higher. In such applications, current-mode logic (CML) latch circuits are often used. However, in many applications a CML latch circuit has a direct current (DC) power path and consumes higher power than complementary metal oxide semiconductor (CMOS) counterparts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
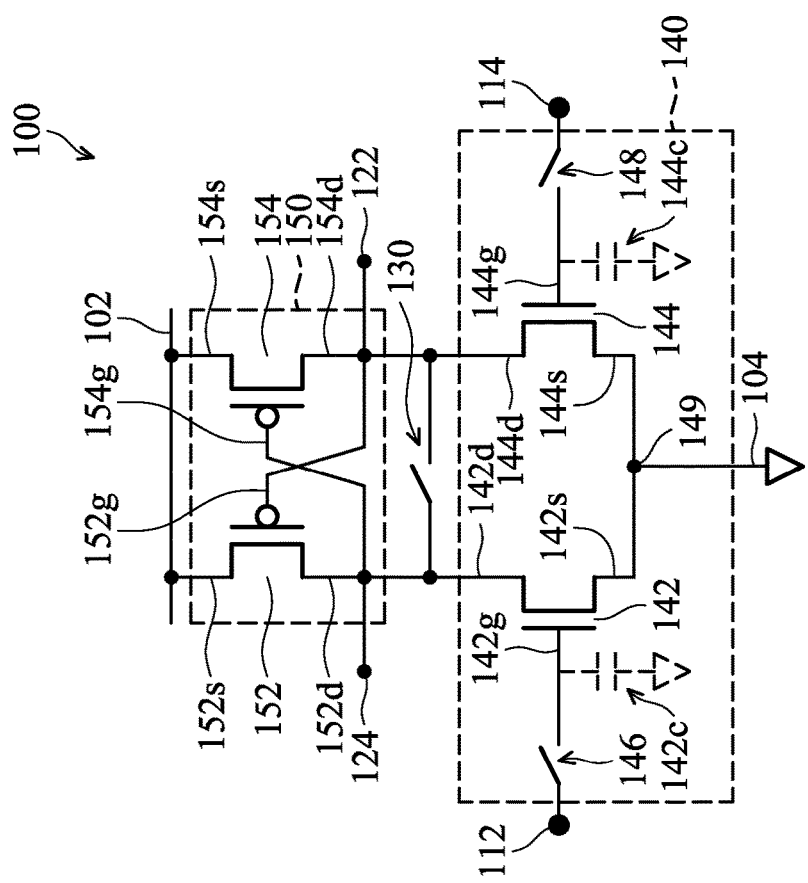
FIG. 1 is a circuit diagram of a latch circuit in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In some embodiments, a latch circuit has a switching device between the non-inverting and inverting output nodes of the latch circuit. The switching device is turned on to bring the voltage levels at the output nodes to have a voltage difference smaller than a full-swing voltage difference during a pre-evaluate phase, and is turned off during a regenerate phase. By having the switching device, the latch circuit according to the present application has a power consumption level comparable with a CMOS counterpart and an operational speed comparable with a CML counterpart.

FIG. 1 is a circuit diagram of a latch circuit 100 in accordance with some embodiments. Latch circuit 100 includes a first power supply node 102, a second power supply node 104, a first input node 112, a second input node 114, a first output node 122, a second output node 124, a switching device 130 coupled between first output node 122 and second output node 124, a first amplification circuit 140 coupled with second power supply node 104, first input node 112, second input node 114, first output node 122, and second output node 124, and a second amplification circuit 150 coupled with first power supply node 102, first output node 122, and second output node 124.

In some embodiments, first power supply node 102 is configured to carry a first supply voltage VDD, such as a predetermined positive voltage. In some embodiments, second power supply node 104 is configured to carry a second supply voltage VSS, such as a reference ground or a predetermined negative voltage. In some embodiments, first input node 112 and second input node 114 are configured to receive a pair of differential signals. In some embodiments, first input node 112 is also referred to as a non-inverting input, and second input node 114 is also referred as an inverting input. In some embodiments, first output node 122 and second output node 124 are configured to output a pair of differential signals. In some embodiments, first output node 122 is also referred to as a non-inverting output, and second output node 124 is also referred as an inverting output.

First switching device 130 is configured to be turned on in response to a first state of a clock signal CLK (FIG. 2) and to be turned off in response to a second state of clock signal CLK. In some embodiments, the first state of clock signal CLK refers to a logically high state, and the second state of clock signal CLK refers to a logically low state. In some embodiments, when switching device 130 is turned on, switching device 130 functions as a low-resistance resistive device between nodes 122 and 124. In some embodiments, when switching device 130 is turned off, switching device 130 functions as a high-resistance resistive device or an open circuit between nodes 122 and 124.

In some embodiments, switching device 130 is an N-type transistor or a transmission gate. In some embodiments, switching device 130 is a P-type transistor. Based on various implementations of switching device 130, the logical states of the control signal for operating switching device 130 are arranged accordingly.

First amplification circuit 140 includes N-type transistors 142 and 144, configured as a differential pair, and switching devices 146 and 148. Transistor 142 has a source 142s, a drain 142d, and a gate 142g. Transistor 144 has a source 144s, a drain 144d, and a gate 144g. Drain 142d of transistor 142 is coupled with second output node 124. Drain 144d of transistor 144 is coupled with first output node 122. Sources 142s and 144s are coupled with a node 149. Switching device 146 is coupled between gate 142g of transistor 142 and first input node 112. Switching device 146 is configured to be turned on in response to the first state of clock signal CLK and to be turned off in response to the second state of clock signal CLK. Switching device 148 is coupled between gate 144g of transistor 144 and second input node 114. Switching device 148 is also configured to be turned on in response to the first state of clock signal CLK and to be turned off in response to the second state of clock signal CLK.

In operation, first amplification circuit 140 is configured to cause a first voltage difference across switching device 130 based on voltage levels of first input node 112 and second input node 114 in response to the first state of clock signal CLK. In some embodiments, an absolute value of the first voltage difference is less than an absolute value of a second voltage difference between the first supply voltage VDD and the second supply voltage VSS.

Furthermore, in response to the second state of clock signal CLK, switching devices 146 and 148 are turned off. Voltage levels at gates 142g and 144g of transistors 142 and 144 are retained for up to a predetermined period of time by parasitic capacitors (labeled as 142c and 144c) at gates 142g and 144g of transistors 142 and 144. The charges retained at parasitic capacitors 142c and 144c are gradually discharged through various leakage paths, and are depleted after the predetermined period of time. In some embodiments, the clock signal CLK has a signal period corresponding to one-fifth to one-tenth of the predetermined period of time. Therefore, during the operation of latch circuit 100, parasitic capacitors 142c and 144c effectively retain the voltage levels at gates 142g and 144g during the time period that switching devices 146 and 148 are turned off.

Second amplification circuit 150 includes P-type transistors 152 and 154. Transistor 152 has a source 152s, a drain 152d, and a gate 152g. Transistor 154 has a source 154s, a drain 154d, and a gate 154g. Sources 152s and 154s of transistors 152 and 154 are coupled with first power supply node 102. Drain 152d of transistor 152 is coupled with second output node 124 and gate 154g of transistor 154. Drain 154d of transistor 154 is coupled with first output node 122 and gate 152g of transistor 152.

In operation, second amplification circuit 150 is configured to cause a third voltage difference across switching device 130 based on the first voltage difference across switching device 130 in response to the second state of clock signal CLK. In some embodiments, an absolute value of the first voltage difference is less than an absolute value of the third voltage difference. In some embodiments, the absolute value of the third voltage difference is the same as the absolute value of the second voltage difference (i.e., the voltage between the first supply voltage VDD and the second supply voltage VSS).

The channel types of transistors and supply voltages of latch circuit 100 as presented in this disclosure are provided as an example. In some embodiments, transistors 142 and 144 are P-type transistors, transistors 152 and 154 are N-type transistors, and the voltage level of voltage supply node 104 is greater than the voltage level of voltage supply node 102.

Figure 2:
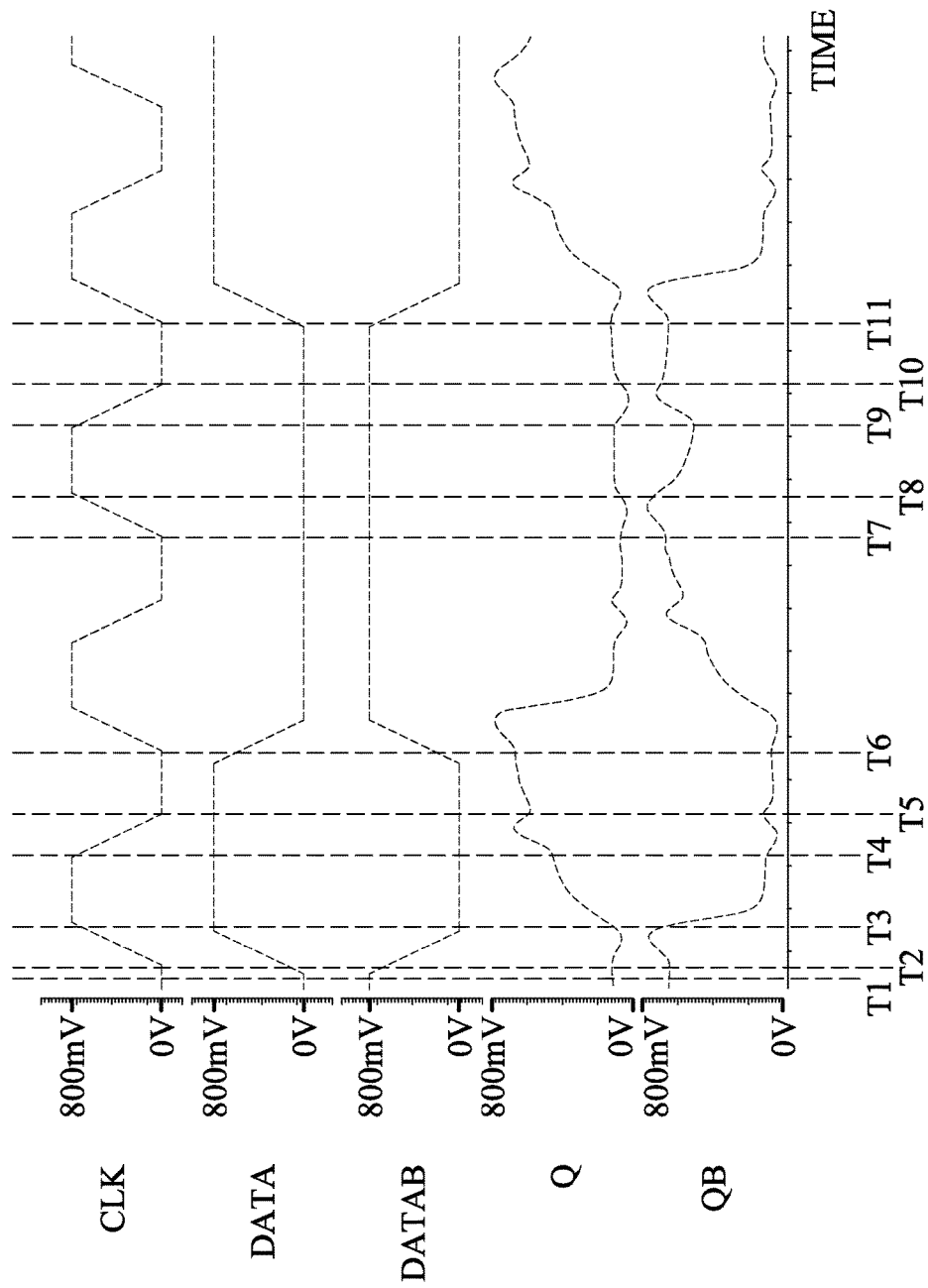
FIG. 2 is a chart of signals at various nodes of the latch circuit of FIG. 1 in accordance with some embodiments.

FIG. 2 is a chart of signals at various nodes of latch circuit 100 of FIG. 1 in accordance with some embodiments. Signal CLK represents the clock signal usable to control switching devices 130, 146, and 148 (FIG. 1). Signal DATA represents the signal at input node 112. Signal DATAB represents the signal at input node 114. Signal Q represents the signal at output node 122. Signal QB represents the signal at output node 124. Also, in the embodiment depicted in FIG. 2, the first supply voltage VDD is set to be 800 mV, and the second supply voltage VSS is set to be 0 V. In some embodiments, voltage VDD corresponds to a logically high state, and voltage VSS corresponds to a logically low state. Signals CLK, DATA, DATAB, Q, and QB and voltage levels of VDD and VSS as presented in FIG. 2 are examples for illustrating the operation of latch circuit 100.

At time T1, signal DATA starts to transition from voltage VSS to voltage VDD. Based on the logical value of signal DATA that latch circuit 100 stored prior to time T1, signal Q is at a logically low state and has a voltage level close to voltage VSS, and signal QB is at a logically high state and has a voltage level close to voltage VDD.

At time T2, signal CLK starts to transition from voltage VSS to voltage VDD. As a result, switching devices 130, 146, and 148 start to be turned on. The operation of switching devices 130, 146, and 148 causes signal fluctuations at nodes 122 and 124. However, the cross-coupled transistors 152 and 154 of amplification circuit 150 causes signal Q to remain at a voltage level close to voltage VSS and signal QB to remain at a voltage level close to voltage VDD.

At time T3, signal CLK has a voltage level of voltage VDD, which is sufficient to turn on switching devices 130, 146, and 148. Switching devices 130, 146, and 148 thus function as low-resistance resistive devices. Meanwhile, signal DATA has a voltage level of voltage VDD (and signal DATAB has a voltage level of voltage VSS) representing a logically high value to be stored in latch 100. Gate 142g of transistor 142 thus has a voltage level of voltage VDD, and transistor 142 is turned on. Gate 144g of transistor 144 has a voltage level of voltage VSS, and transistor 144 is turned off. Because transistor 142 is turned on, signal QB is pulled toward voltage VSS. Signal QB then starts to turn on transistor 154 which, in turn, gradually turns off transistor 152.

Because switching device 130 is turned on and functions as a low-resistance resistive device between node 122 and 124, the signal transitioning of signals Q and QB is further assisted by the charge sharing and between gates 152g and 154g through switching device 130. The turned-on switching device 130 pulls signals Q and QB toward about a mid-point between voltage VDD and voltage VSS. Also, the resistance of turned-on switching device 130 allows the voltage levels of signals Q and QB to be further pulled away from each other by transistors 142, 144, 152, and 154. However, the resistance of the turned-on switching device 130 also limits the voltage difference between signals Q and QB to be less than a full swing between voltage VDD and voltage VSS.

At time T4, signal CLK starts to transition from voltage VDD to voltage VSS. As a result, switching devices 130, 146, and 148 start to be turned off. The resistance of switching device 130 is increased, and amplification circuit 150 is able to further increase the voltage difference between signals Q and QB. Transistor 142 remains turned-on and transistor 144 remains turned-off because of at least the voltage levels stored at gates 142g and 144g by the parasitic capacitors 142c and 144c.

At time T5, signal CLK has a voltage level of voltage VSS, which is sufficient to turn off switching devices 130, 146, and 148. Switching devices 130, 146, and 148 thus function as open circuits or as high-resistance resistive devices having resistance much greater than that of their corresponding turned-on state. Amplification circuit 150 pulls one of signals Q and QB, such as signal Q in FIG. 2, toward voltage VDD based on the voltage difference between signals Q and QB developed during a time period from time T3 to time T4. Meanwhile, amplification circuit 140 pulls the other one of signals Q and QB, such as signal QB in FIG. 2, toward voltage VSS based on the voltages at gates 142g and 144g. During a time period from time T5 and time T6, signal CLK remains at a voltage level of voltage VSS. Signal Q has a voltage level close to voltage VDD, and signal QB has a voltage level close to voltage VSS to store the logical value corresponding to signal DATA at the time period from time T3 to T4.

In some embodiments, the time period from time T3 to T4 is also referred to as a pre-evaluate phase of operating latch circuit 100, and the time period from time T5 to T6 is also referred to as a regenerate phase of operating latch circuit 100.

At time T6, signal CLK starts to transition from voltage VSS to voltage VDD, which begins another clock cycle of pre-evaluate phase and regenerate phase of operating latch circuit 100. During the clock cycle beginning at time T6, signal DATA is at the logical low state (having voltage VSS) and signal DATAB is at the logical high state (having voltage VDD). Latch circuit 100 stores the signals DATA and DATAB by pulling signal Q toward voltage VSS and pulling signal QB toward voltage VDD. Because the electrical devices of latch circuit 100 have a symmetric arrangement, the operations of pulling signal QB toward voltage VDD is performed in a manner similar to the operation of pulling signal Q toward voltage VDD illustrated above.

At time T7, signal DATA remains at voltage VSS, and signal DATAB remains at voltage VDD. Signal CLK starts to transition from voltage VSS to voltage VDD. As a result, switching devices 130, 146, and 148 start to be turned on. The operation of switching devices 130, 146, and 148 causes signal fluctuations at nodes 122 and 124. However, the cross-coupled transistors 152 and 154 of amplification circuit 150 causes signal Q to remain at a voltage level close to voltage VSS and signal QB to remain at a voltage level close to voltage VDD.

At time T8, signal CLK has a voltage level of voltage VDD, which is sufficient to turn on switching devices 130, 146, and 148. Gate 142g of transistor 142 has a voltage level of voltage VSS from signal DATA, and transistor 142 is turned off. Gate 144g of transistor 144 has a voltage level of voltage VDD from signal DATAB, and transistor 144 is turned on. Because transistor 144 is turned on, signal Q is pulled toward voltage VSS and keeps transistor 152 on. Signal QB thus remains at a level of being pulled toward voltage VDD and turns transistor 154 off. Meanwhile, because switching device 130 is turned on and functions as a low-resistance resistive device between node 122 and 124, signals Q and QB are also pulled toward a mid-point between voltage VDD and voltage VSS through switching device 130. The resistance of turned-on switching device 130 limits the voltage difference between signals Q and QB to be less than a full swing between voltage VDD and voltage VSS. The fighting of various conductive paths ends up pulling signal Q slightly higher than voltage VSS and pulling signal QB toward the mid-point between voltage VDD and voltage VSS.

At time T9, signal CLK starts to transition from voltage VDD to voltage VSS. As a result, switching devices 130, 146, and 148 start to be turned off. The resistance of switching device 130 is increased, and amplification circuit 150 is able to further increase the voltage difference between signals Q and QB. Transistor 142 remains off and transistor 144 remains on at least because of the voltage levels stored at gates 142g and 144g through the parasitic capacitors 142c and 144c.

At time T10, signal CLK has a voltage level of voltage VSS, which is sufficient to turn off switching devices 130, 146, and 148. Amplification circuit 150 pulls signal QB toward voltage VDD based on the voltage difference between signals Q and QB at time T9. Meanwhile, amplification circuit 140 pulls signal Q toward voltage VSS based on the voltages at gates 142g and 144g. During a time period from time T10 and time T11, signal CLK remains at a voltage level of voltage VSS. Signal Q has a voltage level close to voltage VSS, and signal QB has a voltage level close to voltage VDD to store the logical value corresponding to signal DATA at the time period from time T8 to T9.

In some embodiments, the time period from time T8 to T9 corresponds to the pre-evaluate phase of operating latch circuit 100, and the time period from time T10 to T11 corresponds to the regenerate phase of operating latch circuit 100.

At time T11, signal CLK starts to transition from voltage VSS to voltage VDD, which begins another clock cycle of pre-evaluate phase and regenerate phase of operating latch circuit 100.

Moreover, the clock cycle starting at time T7 illustrated above corresponds to the operation of retaining signal Q close to voltage VSS in response to signal DATA that is at voltage VSS. Because the electrical devices of latch circuit 100 have a symmetric arrangement, the operation of retaining signal QB close to voltage VSS in response to signal DATAB that is at voltage VSS is performed in a manner similar to the operation illustrated in conjunction with time T7 to time T11.

Figure 3:
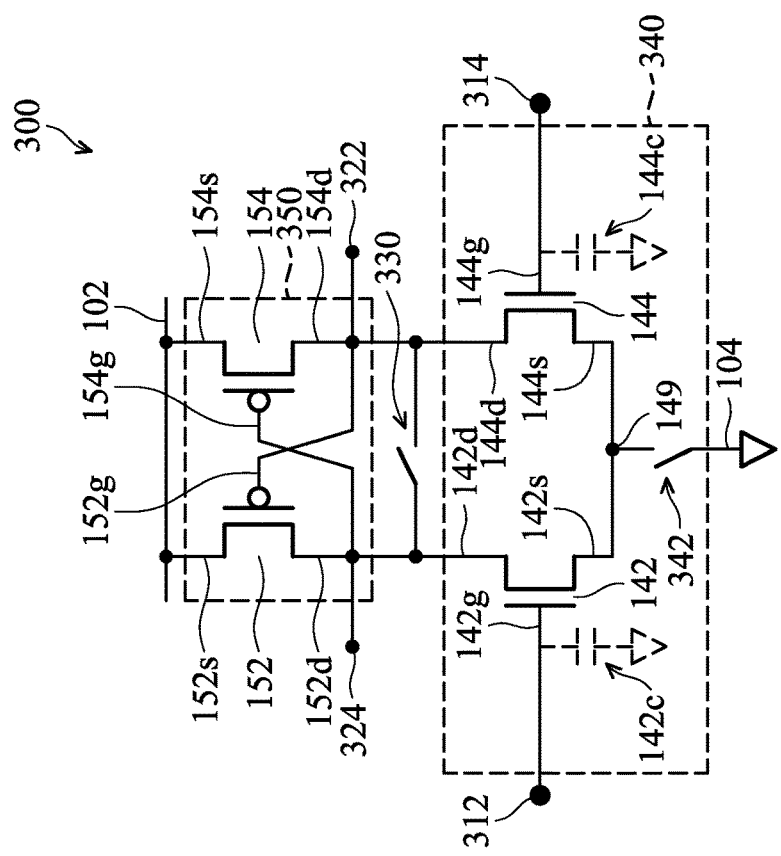
FIG. 3 is a circuit diagram of another latch circuit in accordance with some embodiments.

FIG. 3 is a circuit diagram of another latch circuit 300 in accordance with some embodiments. Components in FIG. 3 that are the same as or similar to those depicted in FIG. 1 are given the same reference numbers, and detailed description thereof is thus omitted.

Latch circuit 300 includes a first power supply node 102, a second power supply node 104, a first input node 312, a second input node 314, a first output node 322, a second output node 324, a switching device 330 coupled between first output node 322 and second output node 324, a first amplification circuit 340 coupled with second power supply node 104, first input node 312, second input node 314, first output node 322, and second output node 324, and a second amplification circuit 350 coupled with first power supply node 102, first output node 322, and second output node 314.

First amplification circuit 340 corresponds to amplification circuit 140 in FIG. 1 and includes N-type transistors 142 and 144 configured as a differential pair and switching device 342. Compared with amplification circuit 140 in FIG. 1, switching devices 146 and 148 are omitted, and switching device 342 is between power supply node 104 and common node 149. Switching device 330 corresponds to switching device 130. Switching device 330 and switching device 342 are configured to be controlled that only one of switching device 330 and switching device 342 is turned on at a time. In some embodiments, switching device 330 is turned on and switching device 342 is turned off responsive to the first state of clock signal CLK; and switching device 330 is turned off and switching device 342 is turned on responsive to the second state of clock signal CLK. In some embodiments, switching device 330 is controlled by a control signal CLK, and switching device 342 is controlled by a control signal CLKB that is logically complementary to signal CLK.

In operation, first amplification circuit 340 is configured to cause a first voltage difference across switching device 330 based on voltage levels of first input node 312 and second input node 314 in response to the first state of clock signal CLK. In some embodiments, an absolute value of the first voltage difference is less than an absolute value of a second voltage difference between the first supply voltage VDD and the second supply voltage VSS.

Second amplification circuit 350 corresponds to amplification 150 in FIG. 1. In operation, second amplification circuit 350 is configured to cause a third voltage difference across switching device 330 based on the first voltage difference across switching device 330 in response to the second state of clock signal CLK. In some embodiments, an absolute value of the first voltage difference is less than an absolute value of the third voltage difference. In some embodiments, the absolute value of the third voltage difference is the same as the absolute value of the second voltage difference (i.e., the voltage between the first supply voltage VDD and the second supply voltage VSS).

The channel types of transistors and supply voltages of latch circuit 300 are provided as an example. In some embodiments, transistors 142 and 144 are P-type transistors, transistors 152 and 154 are N-type transistors, and the voltage level of voltage supply node 104 is greater than the voltage level of voltage supply node 102.

In latch circuit 300, the power supply node 104 in latch circuit 300 is not always coupled with transistors 142 and 144. Having power supply node 104 coupled with transistors 142 and 144 all the time, such as that in latch circuit 100, provides a direct current (DC) conductive path between power supply nodes 102 and 104 to speed up transitioning signal Q or QB from voltage VSS to VDD, and vice versa. However, a DC current also comes with the DC conductive path. Therefore, compared with the latch circuit 100 having comparable device sizes, latch circuit 300 consume less power at a cost of slower signal transitioning speed.

Figure 4:
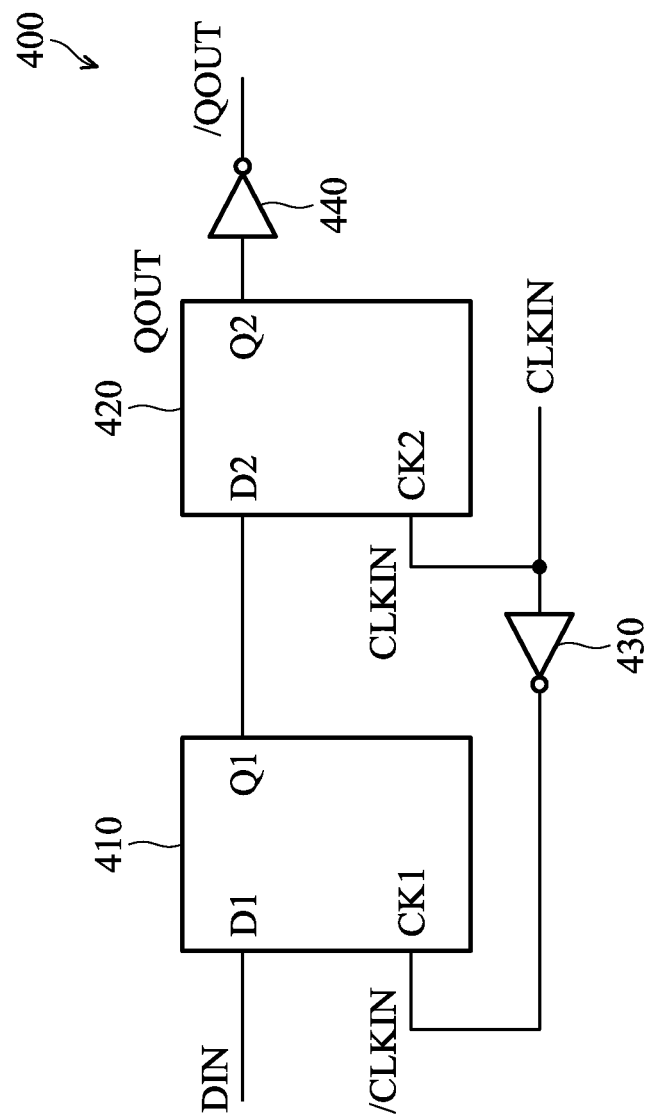
FIG. 4 is a functional block diagram of a master-slave flip-flop circuit in accordance with some embodiments.

FIG. 4 is a functional block diagram of a master-slave flip-flop circuit 400 in accordance with some embodiments. Flip-flop circuit 400 is used to illustrate an application of latch circuit 100 and/or latch circuit 300. In some embodiments, flip-flop circuit 400 is usable as a frequency/phase detector in a signal recovery circuit in a communication system.

Flip-flop circuit 400 includes a master latch circuit 410, a slave latch circuit 420, and inverters 430 and 440. Latch circuit 410 includes a data input node D1, a clock input node CK1, and an output node Q1. Latch circuit 420 includes a data input node D2, a clock input node CK2, and an output node Q2. In some embodiments, latch circuit 410 has a configuration the same as or similar to latch circuit 100 or latch circuit 300. In some embodiments, latch circuit 420 has a configuration the same as or similar to latch circuit 100 or latch circuit 300. Therefore, in some embodiments, nodes D1 and D2 correspond to input node 112, nodes Q1 and Q2 correspond to output node 122, and node CK1 and CK2 are configured to receive the control signal for switching devices 130, 146, and/or 148. Other nodes and other signals corresponding to logically complementary signals are omitted.

Data input node D1 of latch circuit 410 is configured to receive a data signal DIN. Data output node Q1 of latch circuit 410 is coupled with data input node D2 of latch circuit 420. Clock input node CK1 of latch circuit 410 is configured to receive a clock signal /CLKIN. Inverter 430 receives clock signal CLKIN and generates another clock signal /CLKIN that is logically complementary to clock signal CLKIN. Clock input node CK2 of latch circuit 420 is configured to receive clock signal CLKIN. Data output node Q2 of latch circuit 420 outputs a latch output signal QOUT. Inverter 440 receives output signal QOUT and generates another output signal /QOUT that is logically complementary to output signal QOUT. Inverter 440 is arranged to generate a signal /QOUT that has a predetermined slew rate and/or has predetermined current driving capability.

In some embodiments, inverter 440 is omitted. In some embodiments, inverter 440 is replaced with a buffer circuit, and a regenerated signal QOUT is output from the buffer instead of signal /QOUT.

Figure 5A:
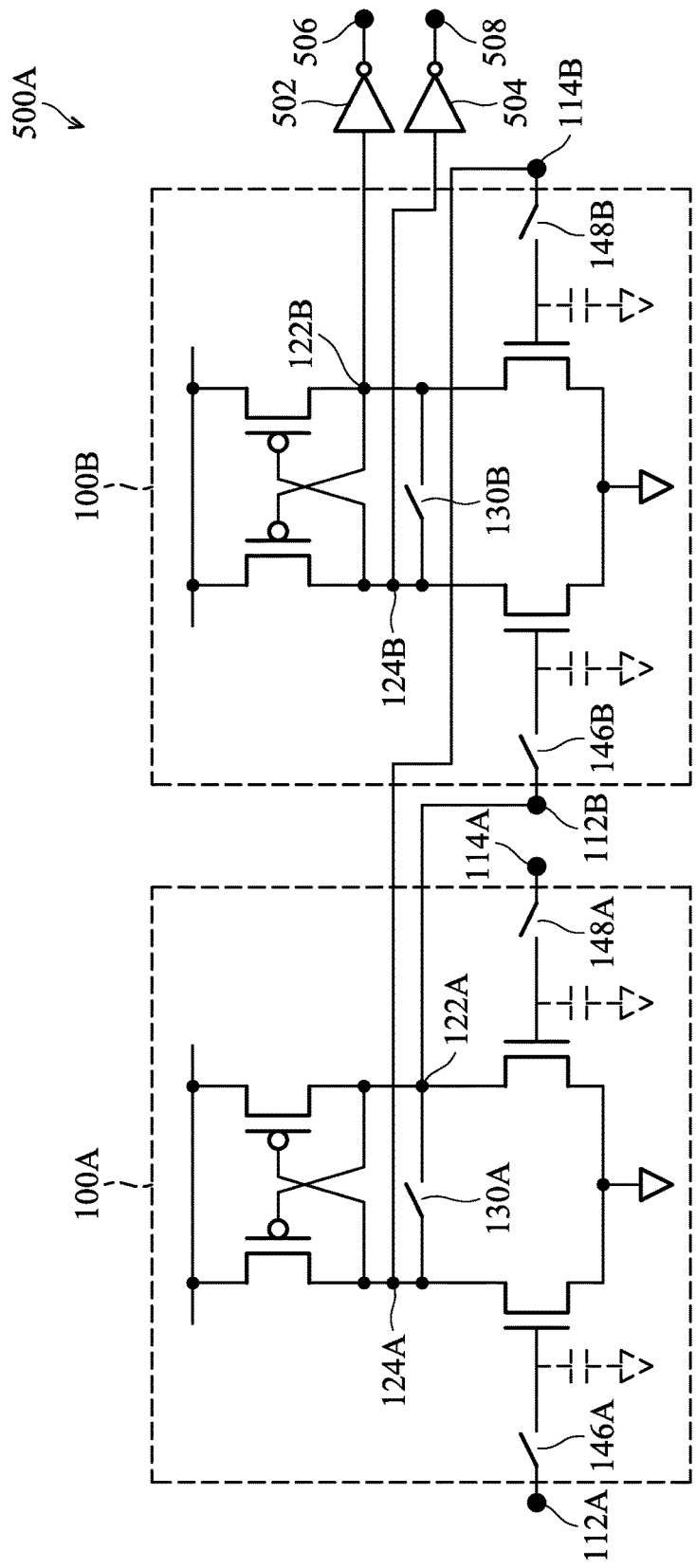
FIGS. 5A-5D are circuit diagrams of example master-slave flip-flop circuits implemented based on the functional block diagram in FIG. 4 in accordance with some embodiments.

FIG. 5A is a circuit diagrams of an example master-slave flip-flop circuit 500A implemented based on the functional block diagram in FIG. 4 in accordance with some embodiments. Flip-flop circuit 500A includes a first latch circuit 100A corresponding to latch circuit 410, a second latch circuit 100B corresponding to latch circuit 420, inverters 502 and 504 corresponding to inverter 440, and output nodes 506 and 508. The components corresponding to inverter 430 are not depicted in FIG. 5A.

First latch circuit 100A is implemented based on latch circuit 100 and has input nodes 112A and 114A corresponding to input nodes 112 and 114; output nodes 122A and 124A corresponding to output nodes 122 and 124; and switching devices 130A, 146A, and 148A corresponding to switching devices 130, 146, and 148. Second latch circuit 100B is implemented based on latch circuit 100 and has input nodes 112B and 114B corresponding to input nodes 112 and 114; output nodes 122B and 124B corresponding to output nodes 122 and 124; and switching devices 130B, 146B, and 148B corresponding to switching devices 130, 146, and 148. Labels and detailed description of other components of latch circuit 100A and latch circuit 100B are omitted.

Input node 112A is configured to receive data signal DIN as the input signal DATA, and input node 114A is configured to receive a data signal that is logically complementary to data signal DIN as input signal DATAB. Clock signal CLKIN is used by latch circuit 100A as clock signal CLK. Switching devices 130A, 146A, and 148A are configured to be turned on in response to a first state of clock signal /CLKIN, and to be turned off in response to a second state of clock signal /CLKIN.

Output node 122A is coupled with input node 112B of latch circuit 100B, and output node 124A is coupled with input node 114B. Clock signal CLKIN is used by latch circuit 100B as clock signal CLK. Switching devices 130B, 146B, and 148B are configured to be turned on in response to a first state of clock signal CLKIN or the second state of clock signal /CLKIN, and to be turned off in response to a second state of clock signal CLKIN or the first state of clock signal /CLKIN. Output node 122B outputs signal Q and output node 124B outputs signal QB. Inverter 502 receives output signal QOUT at node 122B and generates an output signal at node 506 that is logically complementary to signal QOUT. Inverter 504 receives output signal /QOUT at node 124B and generates an output signal at node 508 that is logically complementary to signal /QOUT.

In operation, when clock signal /CLKIN is logically high, latch circuit 100A is at pre-evaluate phase and latch circuit 100B is at regenerate phase. When clock signal /CLKIN is logically low, latch circuit 100A is at regenerate phase and latch circuit 100B is at pre-evaluate phase. Detailed description of the operations of individual latch circuits 100A and 100B were the same as latch circuit 100 in FIG. 1 and is thus omitted.

Figure 5B:
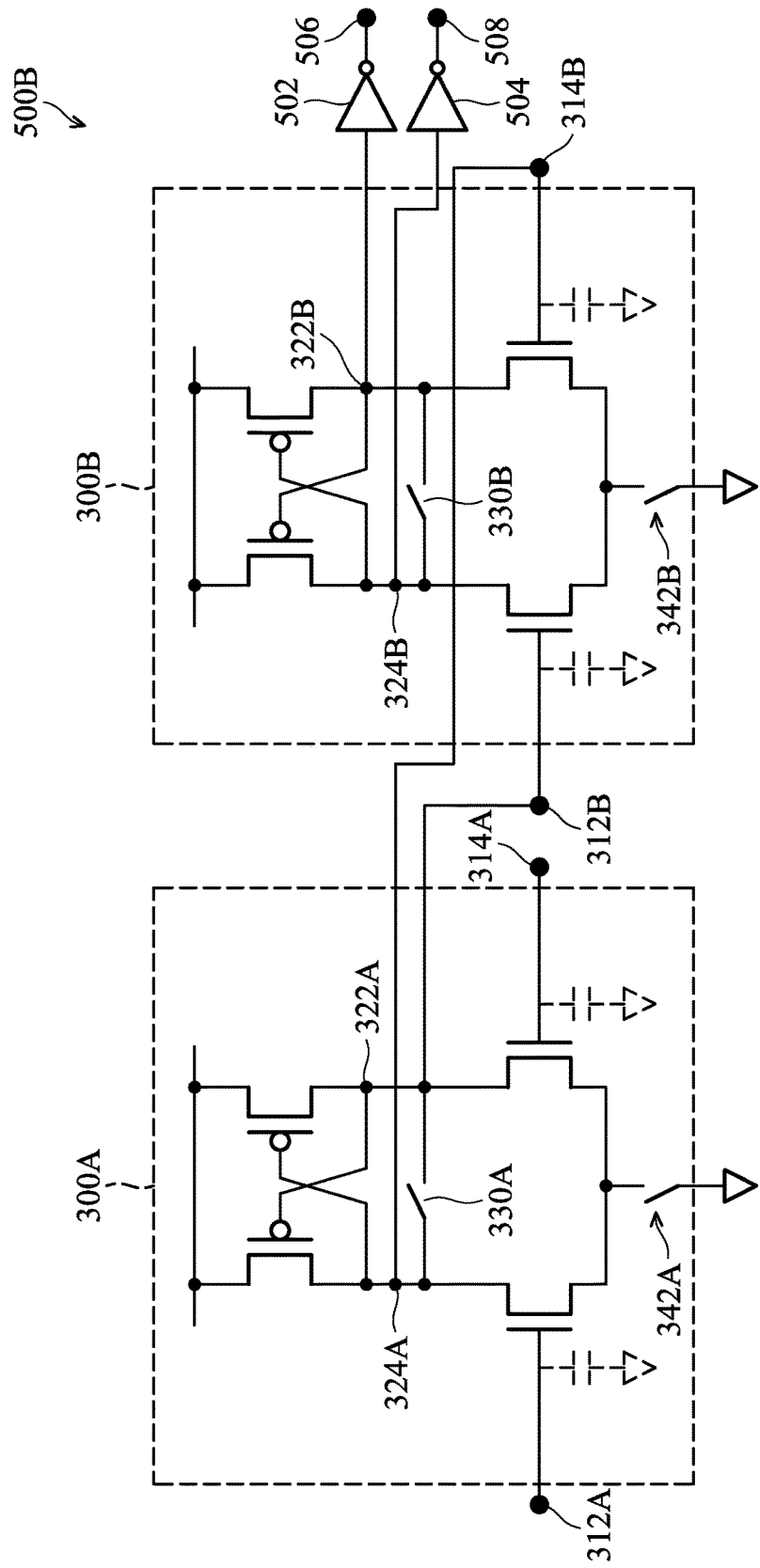

FIG. 5B is a circuit diagrams of an example master-slave flip-flop circuit 500B implemented based on the functional block diagram in FIG. 4 in accordance with some embodiments. Flip-flop circuit 500B includes a first latch circuit 300A corresponding to latch circuit 410, and a second latch circuit 300B corresponding to latch circuit 420. The components corresponding to inverter 430 are not depicted in FIG. 5B. Components depicted in FIG. 5B that are the same as or similar to those in FIG. 5A are given the same reference numbers.

First latch circuit 300A is implemented based on latch circuit 300 and has input nodes 312A and 314A corresponding to input nodes 312 and 314; output nodes 322A and 324A corresponding to output nodes 322 and 324; and switching devices 330A and 342A corresponding to switching devices 330 and 342. Second latch circuit 300B is implemented based on latch circuit 300 and has input nodes 312B and 314B corresponding to input nodes 312 and 314; output nodes 322B and 324B corresponding to output nodes 322 and 324; and switching devices 330B and 342B corresponding to switching devices 330 and 342. Detailed description of other components of latch circuit 300A and latch circuit 300B is omitted.

Input node 312A is configured to receive data signal DIN as the signal DATA, and input node 314A is configured to receive a data signal that is logically complementary to data signal DIN. Clock signal /CLKIN is used by latch circuit 300A as clock signal CLK. Switching device 330A is configured to be turned on in response to a first state of clock signal /CLKIN, and to be turned off in response to a second state of clock signal /CLKIN. Switching device 342A is configured to be turned off in response to the first state of clock signal CLKIN, and to be turned on in response to the second state of clock signal CLKIN.

Output node 322A is coupled with input node 312B of latch circuit 300B, and output node 324A is coupled with input node 314B. Clock signal CLKIN is used by latch circuit 300B as clock signal CLK. Switching device 330B is configured to be turned on in response to a first state of clock signal CLKIN or the second state of clock signal /CLKIN, and to be turned off in response to a second state of clock signal CLKIN or the first state of clock signal /CLKIN. Switching device 342B is configured to be turned off in response to the first state of clock signal CLKIN or the second state of clock signal /CLKIN, and to be turned on in response to the second state of clock signal CLKIN or the first state of clock signal /CLKIN. Inverter 502 receives output signal QOUT at node 322B and generates an output signal /QOUT at node 506. Inverter 504 receives output signal at node 324B that is logically complementary to signal QOUT and generates an output signal at node 508 that is logically complementary to signal /QOUT.

In operation, when clock signal /CLKIN is logically high, latch circuit 300A is at pre-evaluate phase and latch circuit 300B is at regenerate phase. When clock signal /CLKIN is logically low, latch circuit 300A is at regenerate phase and latch circuit 300B is at pre-evaluate phase. Detailed description of the operations of individual latch circuits 300A and 300B were the same as latch circuit 300 in FIG. 3 and is thus omitted.

Figure 5C:
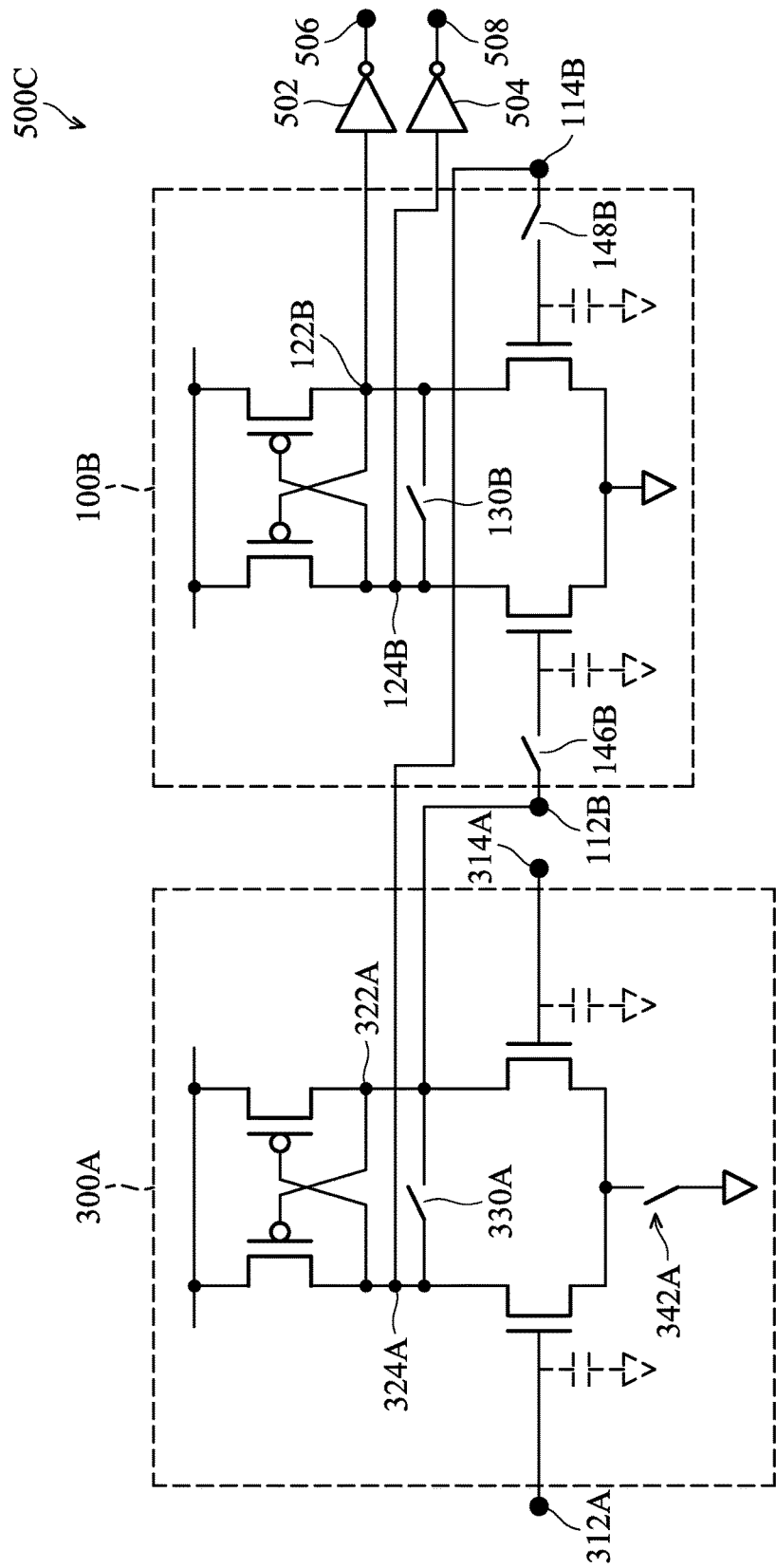

FIG. 5C is a circuit diagrams of an example master-slave flip-flop circuit 500C implemented based on the functional block diagram in FIG. 4 in accordance with some embodiments. Flip-flop circuit 500C includes a first latch circuit 300A corresponding to latch circuit 410, and a second latch circuit 100B corresponding to latch circuit 420. The components corresponding to inverter 430 are not depicted in FIG. 5C. Components depicted in FIG. 5C that are the same as or similar to those in FIG. 5A and FIG. 5B are given the same reference numbers.

In operation, when clock signal /CLKIN is logically high, latch circuit 300A is at pre-evaluate phase and latch circuit 100B is at regenerate phase. When clock signal /CLKIN is logically low, latch circuit 300A is at regenerate phase and latch circuit 100B is at pre-evaluate phase. Operations of latch circuit 300A and latch circuit 100B are similar to the operations of 300A and 100B illustrated above in conjunction with FIGS. 5A and 5B, and detailed description thereof is thus omitted.

Figure 5D:
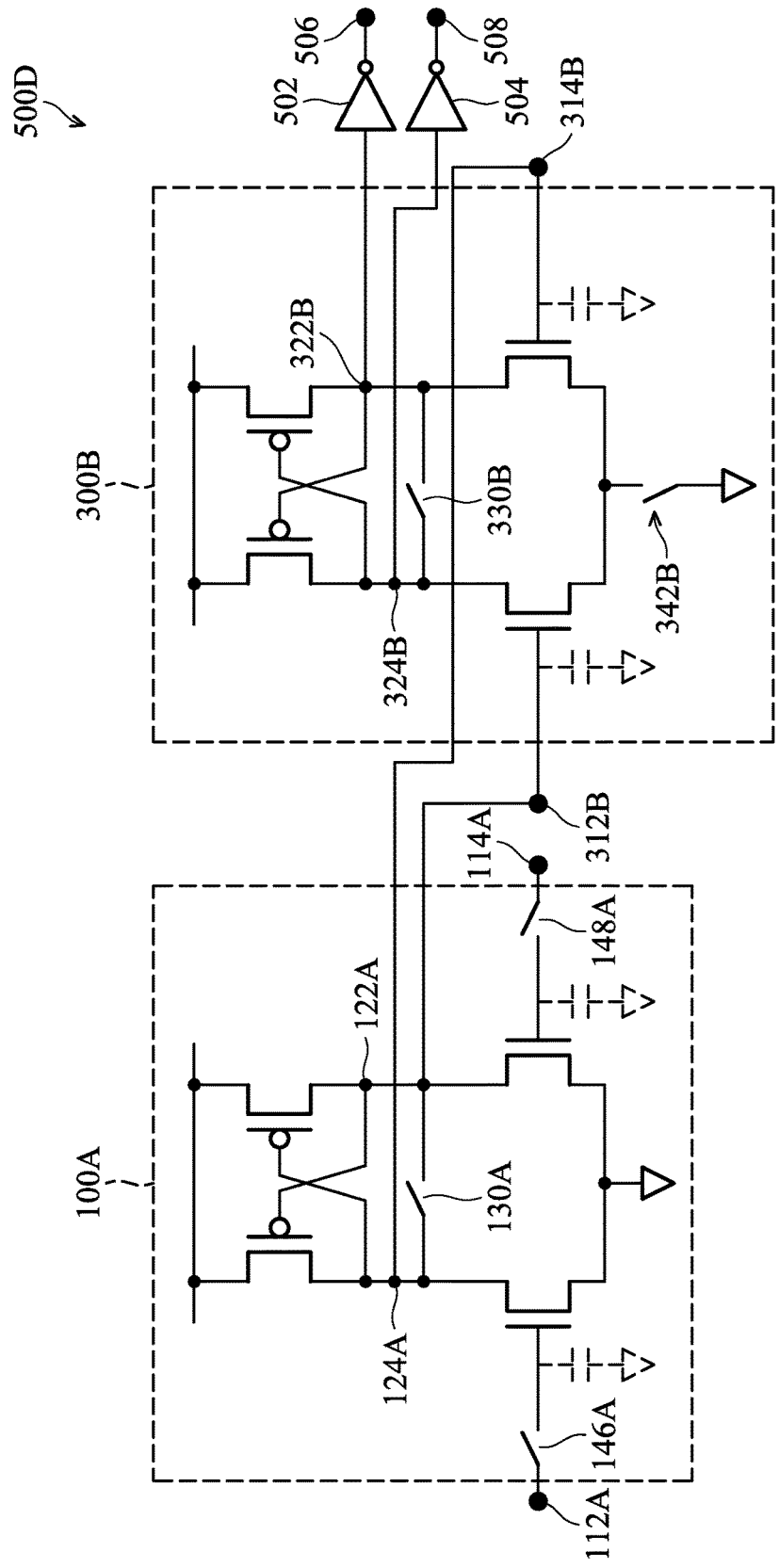

FIG. 5D is a circuit diagrams of an example master-slave flip-flop circuit 500D implemented based on the functional block diagram in FIG. 4 in accordance with some embodiments. Flip-flop circuit 500C includes a first latch circuit 100A corresponding to latch circuit 410, and a second latch circuit 300B corresponding to latch circuit 420. The components corresponding to inverter 430 are not depicted in FIG. 5D. Components depicted in FIG. 5D that are the same as or similar to those in FIG. 5A and FIG. 5B are given the same reference numbers.

In operation, when clock signal /CLKIN is logically high, latch circuit 100A is at pre-evaluate phase and latch circuit 300B is at regenerate phase. When clock signal /CLKIN is logically low, latch circuit 100A is at regenerate phase and latch circuit 300B is at pre-evaluate phase. Operations of latch circuit 100A and latch circuit 300B are similar to the operations of 100A and 300B illustrated above in conjunction with FIGS. 5A and 5B, and detailed description thereof is thus omitted.

Figure 6:
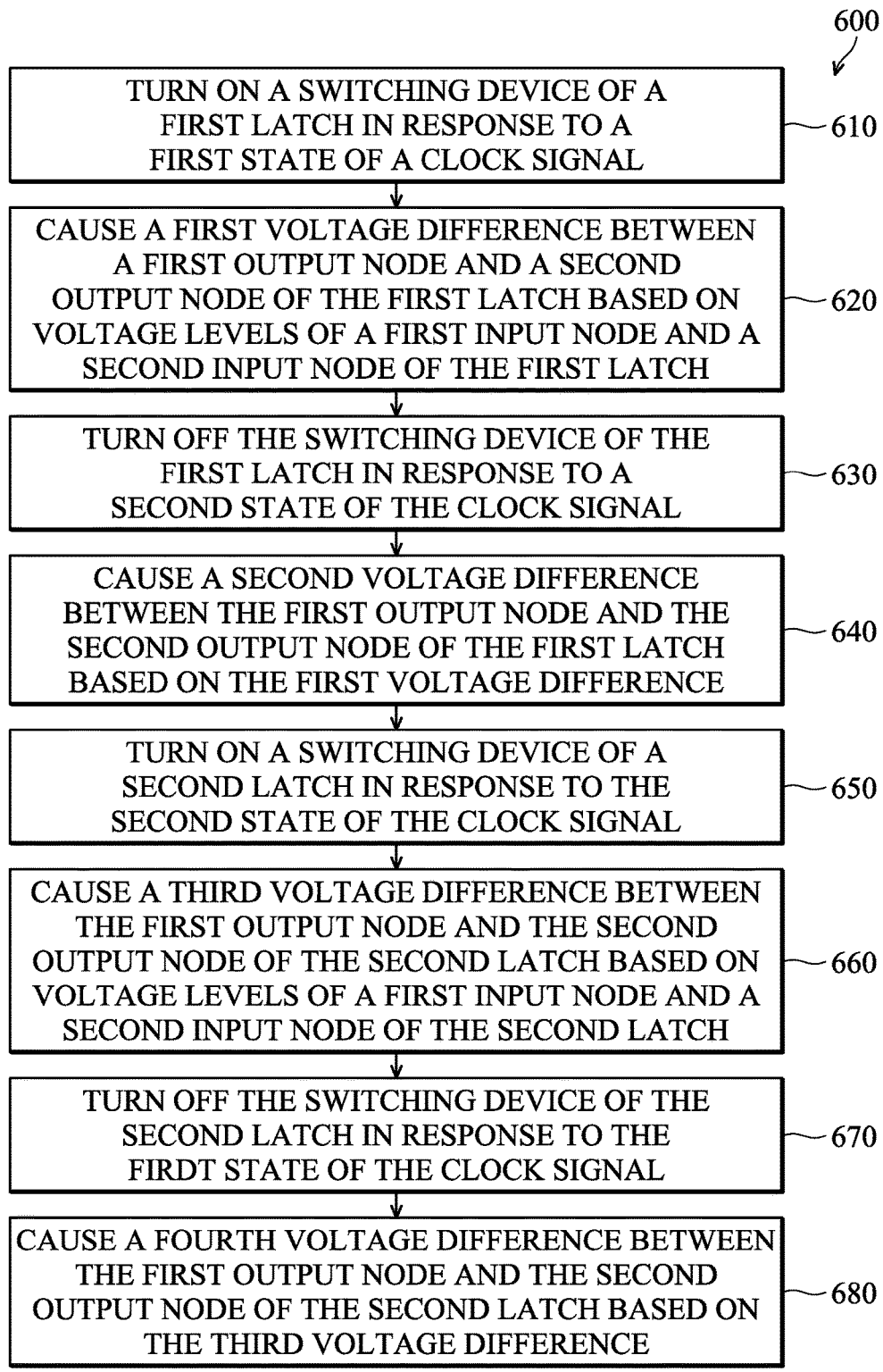
FIG. 6 is a flow chart of a method of operating a latch circuit or a flip-flop circuit in accordance with some embodiments.

FIG. 6 is a flow chart of a method of operating a latch circuit, such as latch circuit 100 or 300, or a flip-flop circuit, such as flip-flop circuit 500A-500D, in accordance with some embodiments. Operations 610 to 640 correspond to the operations of operating a single latch circuit 100 or 300 or the master latch circuit of a master-slave flip-flop circuit 500A-500D. Operations 650 to 680 correspond to operating the slave latch circuit of a master-slave flip-flop circuit 500A-500D. It is understood that additional operations may be performed before, during, and/or after the method 600 depicted in FIG. 6, and that some other processes may only be briefly described herein.

Method 600 begins with operation 610, where a first switching device of a latch circuit, such as switching circuit 130 or 330 of latch circuit 100 or 300, or switching circuit 130A or 330A of master latch circuit 100A or 300A, is turned on in response to a first state of a clock signal CLK or CLKIN. The first switching device is coupled between two output nodes of the corresponding latch circuit.

The method 600 proceeds to operation 620, where a first voltage difference between the first output node and the second output node is caused by a first amplification circuit, such as amplification circuit 140 or 340 of latch circuit 100 or 300 or the corresponding components of latch circuit 100A or 300A, based on voltage levels of a first input node and a second input node of the latch circuit in response to the first state of the clock signal CLK or CLKIN.

The method 600 proceeds to operation 630, where the first switching device is turned off in response to a second state of the clock signal CLK or CLKIN.

The method 600 proceeds to operation 640, where a second voltage difference between the first output node and the second output node is caused by a second amplification circuit, such as amplification circuit 150 or 350 of latch circuit 100 or 300 or the corresponding components of latch circuit 100A or 300A, based on the first voltage difference in response to the second state of the clock signal CLK or CLKIN. An absolute value of the first voltage difference is less than an absolute value of the second voltage difference.

With regard to operating a single latch circuit 100 or 300, there is no other latch circuit, and operations 650-680 are thus omitted. With regard to operating master-slave flip-flop circuit 500A-500D, the method 600 proceeds to operations 650-680 with regard to operating the slave latch circuit.

In operation 650, a second switching device of a slave latch circuit, such as switching circuit 130B or 330B of latch circuit 100B or 300B, is turned on in response to the second state of clock signal CLKIN. The second switching device is coupled between two output nodes of the corresponding slave latch circuit.

The method 600 proceeds to operation 660, where a third voltage difference between the first output node and the second output node of the slave latch circuit is caused by a first amplification circuit of the slave latch circuit, such as components corresponding in latch circuit 100B or 300B to amplification circuit 140 or 340, based on voltage levels of a first input node and a second input node of the latch circuit in response to the second state of the clock signal CLKIN.

The method 600 proceeds to operation 670, where the second switching device is turned off in response to the first state of the clock signal CLKIN.

The method 600 proceeds to operation 680, where a fourth voltage difference between the first output node and the second output node of the slave latch circuit is caused by a second amplification circuit of the slave latch circuit, such as amplification components in latch circuit 100B or 300B corresponding to circuit 150 or 350, based on the third voltage difference in response to the first state of the clock signal CLKIN. An absolute value of the third voltage difference is less than an absolute value of the fourth voltage difference.

In accordance with one embodiment, a latch circuit includes a first power supply node configured to carry a first supply voltage, a second power supply node configured to carry a second supply voltage, a first input node, a second input node, a first output node, a second output node, a first switching device coupled between the first output node and the second output node, and a first amplification circuit coupled with the second power supply node, the first input node, the second input node, the first output node, and the second output node. The first switching device is configured to be turned on in response to a first state of a clock signal and to be turned off in response to a second state of the clock signal. The first amplification circuit is configured to cause a first voltage difference across the first switching device based on voltage levels of the first input node and the second input node in response to the first state of the clock signal, and an absolute value of the first voltage difference is less than an absolute value of a second voltage difference between the first supply voltage and the second supply voltage.

In accordance with another embodiment, a flip-flop circuit includes a first power supply node configured to carry a first supply voltage, a second power supply node configured to carry a second supply voltage, a first latch circuit, and a second latch circuit. The first latch circuit includes a first input node, a second input node, a first output node, a second output node, a first switching device coupled between the first output node and the second output node, and a first amplification circuit coupled with the second power supply node, the first input node, the second input node, the first output node, and the second output node. The first switching device is configured to be turned on in response to a first state of a clock signal and to be turned off at a high resistance state in response to a second state of the clock signal. The first amplification circuit is configured to cause a first voltage difference across the first switching device based on voltage levels of the first input node and the second input node in response to the first state of the clock signal. An absolute value of the first voltage difference is less than an absolute value of a second voltage difference between the first supply voltage and the second supply voltage. The second latch circuit includes a third input node electrically coupled with the second output node, a fourth input node electrically coupled with the first output node, a third output node, a fourth output node, and a second switching device coupled between the third output node and the fourth output node. The second switching device is configured to be turned on in response to the second state of the clock signal and to be turned off in response to the first state of the clock signal.

In accordance with another embodiment, a method includes turning on a first switching device in response to a first state of a clock signal, where the first switching device is coupled between a first output node of a first latch circuit and a second output node of the first latch circuit. A first voltage difference between the first output node and the second output node is caused by a first amplification circuit based on voltage levels of a first input node of the first latch circuit and a second input node of the first latch circuit in response to the first state of the clock signal. The first switching device is turned off in response to a second state of the clock signal. A second voltage difference between the first output node and the second output node is caused by a second amplification circuit based on the first voltage difference in response to the second state of the clock signal, and an absolute value of the first voltage difference is less than an absolute value of the second voltage difference.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A latch circuit, comprising:
  a first power supply node configured to carry a first supply voltage;
  a second power supply node configured to carry a second supply voltage having a value below a value of the first supply voltage;
  a first input node;
  a second input node;
  a first output node;
  a second output node;
  a first switching device coupled between the first output node and the second output node, the first switching device being configured to be turned on in response to a first state of a clock signal and to be turned off in response to a second state of the clock signal; and
  a first amplification circuit coupled with the second power supply node, the first input node, and the second input node, the first amplification circuit comprising:
    a first transistor coupled with the second output node;
    a second transistor coupled with the first output node;
    a second switching device coupled between a gate of the first transistor and the first input node, the second switching device being configured to be turned on in response to the first state of the clock signal and to be turned off in response to the second state of the clock signal; and a third switching device coupled between a gate of the second transistor and the second input node, the third switching device being configured to be turned on in response to the first state of the clock signal and to be turned off in response to the second state of the clock signal, the first amplification circuit being configured to cause a first voltage difference across the first switching device based on voltage levels of the first input node and the second input node in response to the first state of the clock signal, an absolute value of the first voltage difference being less than an absolute value of a second voltage difference between the first supply voltage and the second supply voltage, wherein, during the first state of the clock signal, one of the first transistor or the second transistor is configured to be part of a low resistance path from the first power supply node to the second power supply node.

2. The latch circuit of claim 1, further comprising:

a second amplification circuit coupled with the first power supply node, the first output node, and the second output node, the second amplification circuit comprising:

a third transistor having a source coupled with the first power supply node, a drain coupled with the second output node, and a gate coupled with the first output node; and a fourth transistor having a source coupled with the first power supply node, a drain coupled with the first output node, and a gate coupled with the second output node.

3. The latch circuit of claim 2, wherein the third transistor and the fourth transistor are P-type transistors.

4. The latch circuit of claim 2, wherein when the first transistor is part of the low resistance path, the third transistor is part of the low resistance path, and when the second transistor is part of the low resistance path, the fourth transistor is part of the low resistance path.

5. The latch circuit of claim 1, wherein a source of the first transistor and a source of the second transistor are electrically coupled with the second power supply node.

6. The latch circuit of claim 1, wherein the first transistor and the second transistor are N-type transistors.

7. The latch circuit of claim 1, wherein the first switching device is part of the low resistance path.

8. The latch circuit of claim 1, wherein each of the gate of the first transistor and the gate of the second transistor has a parasitic capacitance that retains a charge for a predetermined period of time, and the clock signal has a period corresponding to one-fifth to one-tenth of the predetermined period of time.

9. A flip-flop circuit, comprising:

a first power supply node configured to carry a first supply voltage;

a second power supply node configured to carry a second supply voltage having a value below a value of the first supply voltage;

a first latch circuit, comprising:
a first input node;
a second input node;
a first output node;
a second output node;

a first switching device coupled between the first output node and the second output node, the first switching device being configured to be turned on in response to a first state of a clock signal and to be turned off at a high resistance state in response to a second state of the clock signal; and a first amplification circuit coupled with the second power supply node, the first input node, and the second input node, the first amplification circuit comprising:

a first transistor coupled with the second output node;

a second transistor coupled with the first output node;

a second switching device coupled between a gate of the first transistor and the first input node, the second switching device being configured to be turned on in response to the first state of the clock signal and to be turned off in response to the second state of the clock signal; and a third switching device coupled between a gate of the second transistor and the second input node, the third switching device being configured to be turned on in response to the first state of the clock signal and to be turned off in response to the second state of the clock signal, the first amplification circuit being configured to cause a first voltage difference across the first switching device based on voltage levels of the first input node and the second input node in response to the first state of the clock signal, and an absolute value of the first voltage difference being less than an absolute value of a second voltage difference between the first supply voltage and the second supply voltage, wherein, during the first state of the clock signal, one of the first transistor or the second transistor is configured to be part of a low resistance path from the first power supply node to the second power supply node; and a second latch circuit, comprising:

a third input node electrically coupled with the second output node;

a fourth input node electrically coupled with the first output node;

a third output node;

a fourth output node; and a fourth switching device coupled between the third output node and the fourth output node, the fourth switching device being configured to be turned on in response to the second state of the clock signal and to be turned off in response to the first state of the clock signal.

10. The flip-flop circuit of claim 9, wherein the second latch circuit further comprises:

a second amplification circuit coupled with the second power supply node, the third input node, the fourth input node, the third output node, and the fourth output node, the second amplification circuit being configured to cause a third voltage across the fourth switching device based on voltage levels of the third input node and the fourth input node in response to the second state of the clock signal, an absolute value of the third voltage difference being less than the absolute value of the second voltage difference.

11. The flip-flop circuit of claim 10, wherein the second amplification circuit comprises:

a third transistor having a source electrically coupled with the second power supply node, a drain coupled with the fourth output node, and a gate;

a fourth transistor having a source coupled with the source of the third transistor, a drain coupled with the third output node, and a gate;

a fifth switching device coupled between the gate of the third transistor and the third input node, the fifth switching device being configured to be turned on in response to the second state of the clock signal and to be turned off in response to the first state of the clock signal; and a sixth switching device coupled between the gate of the fourth transistor and the fourth input node, the sixth switching device being configured to be turned on in response to the second state of the clock signal and to be turned off in response to the first state of the clock signal.

12. The flip-flop circuit of claim 10, wherein the second amplification circuit of the second latch circuit comprises:

a third transistor having a source, a drain coupled with the fourth output node of the second latch circuit, and a gate electrically coupled with the third input node;

a fourth transistor having a source coupled with the source of the third transistor, a drain coupled with the third output node, and a gate electrically coupled with the fourth input node; and a fifth switching device coupled between the source of the third transistor and the second power supply node, the fifth switching device being configured to be turned on in response to the first state of the clock signal and to be turned off in response to the second state of the clock signal.

13. The flip-flop circuit of claim 11, wherein each of the gate of the third transistor and the gate of the fourth transistor has a parasitic capacitance that retains a charge for the predetermined period of time.

14. The flip-flop circuit of claim 9, wherein the first switching device is part of the low resistance path.

15. The flip-flop circuit of claim 9, wherein each of the gate of the first transistor and the gate of the second transistor has a parasitic capacitance that retains a charge for a predetermined period of time, and the clock signal has a period corresponding to one-fifth to one-tenth of the predetermined period of time.

16. A method, comprising:

turning on a first switching device in response to a first state of a clock signal, the first switching device being coupled between a first output node of a first latch circuit and a second output node of the first latch circuit;

turning on a second switching device in response to the first state of the clock signal, the second switching device being coupled between a first input node of the first latch circuit and a gate of a first transistor of the first latch circuit;

turning on a third switching device in response to the first state of the clock signal, the third switching device being coupled between a second input node of the first latch circuit and a gate of a second transistor of the first latch circuit, the first transistor and the second transistor being configured as a differential pair;

causing a first voltage difference between the first output node and the second output node by a first amplification circuit based on voltage levels of the first input node of the first latch circuit and the second input node of the first latch circuit in response to the first state of the clock signal;

turning off the first switching device in response to a second state of the clock signal; and causing a second voltage difference between the first output node and the second output node by a second amplification circuit based on the first voltage difference in response to the second state of the clock signal, an absolute value of the first voltage difference being less than an absolute value of the second voltage difference, wherein the first output node and the second output node are coupled between a first power supply node carrying a first supply voltage and a second power supply node carrying a second supply voltage, a value of the second supply voltage is below a value of the first supply voltage, and the first amplification circuit causes the first voltage difference between the first output node and the second output node by conducting current from the first power supply node to the second power supply node through one of the first transistor or the second transistor during the first state of the clock signal.

17. The method of claim 16, further comprising:

turning on a fourth switching device in response to the second state of the clock signal, the fourth switching device being coupled between a first output node of a second latch circuit and a second output node of the second latch circuit;

causing a third voltage difference between the first output node of the second latch circuit and the second output node of the second latch circuit by a first amplification circuit of the second latch circuit based on a voltage level of the first output node of the first latch circuit and a voltage level of the second output node of the first latch circuit in response to the second state of the clock signal;

turning off the fourth switching device in response to the first state of the clock signal; and causing a fourth voltage difference between the first output node of the second latch circuit and the second output node of the second latch circuit by a second amplification circuit of the second latch circuit based on the third voltage difference in response to the first state of the clock signal, an absolute value of the third voltage difference being less than an absolute value of the fourth voltage difference.

18. The method of claim 17, further comprising:

turning on a fifth switching device in response to the first state of the clock signal, the fifth switching device being coupled between a common node of a differential pair of the second latch circuit and the second power supply node.

19. The method of claim 16, wherein conducting current from the first power supply node to the second power supply node through one of the first transistor or the second transistor comprises conducting current through the first switching device.

20. The method of claim 16, wherein causing the first voltage difference comprises retaining a charge with a parasitic capacitance of the gate of the one of the first transistor or the second transistor.

* * * * *